United States Patent
Bourbiaux

(10) Patent No.: US 8,386,225 B2
(45) Date of Patent: Feb. 26, 2013

(54) METHOD OF OPTIMIZING THE DEVELOPMENT OF A FLUID RESERVOIR BY TAKING INTO ACCOUNT A GEOLOGIC AND TRANSIENT EXCHANGE TERM BETWEEN MATRIX BLOCKS AND FRACTURES

(75) Inventor: Bernard Bourbiaux, Rueil-Malmaison (FR)

(73) Assignee: IFP, Cedex (FR)

( * ) Notice: Subject to any disclaimer, the term of this patent is extended or adjusted under 35 U.S.C. 154(b) by 1091 days.

(21) Appl. No.: 12/314,937

(22) Filed: Dec. 19, 2008

(65) Prior Publication Data

US 2009/0164189 A1 Jun. 25, 2009

(30) Foreign Application Priority Data

Dec. 20, 2007 (FR) .................................. 07 09118

(51) Int. Cl.
G06F 7/60 (2006.01)
G06G 7/48 (2006.01)
(52) U.S. Cl. .............................................. 703/10; 703/2
(58) Field of Classification Search ................. 703/2, 10
See application file for complete search history.

(56) References Cited

U.S. PATENT DOCUMENTS

| 6,064,944 | A | 5/2000 | Sarda et al. | |
| 7,373,288 | B2 * | 5/2008 | Bourbiaux et al. | 703/10 |
| 7,565,278 | B2 * | 7/2009 | Li et al. | 703/10 |
| 2002/0013687 | A1 * | 1/2002 | Ortoleva | 703/10 |
| 2002/0016702 | A1 | 2/2002 | Manceau et al. | |
| 2005/0027499 | A1 | 2/2005 | Bourbiaux | |
| 2005/0149307 | A1 * | 7/2005 | Gurpinar et al. | 703/10 |

FOREIGN PATENT DOCUMENTS

| EP | 1 158 312 A1 | 11/2001 |
| FR | 2 757 957 | 7/1996 |
| FR | 2 858 444 | 2/2005 |
| WO | WO 2008/070526 A2 | 6/2008 |

OTHER PUBLICATIONS

Reza Naimi-Tajdar et al: "Matrix Subgridding and Its Effect in Dual Porosity Simulators", IPTC 11195, Dec. 4, 2007, Dec. 6, 2007 XP008097256.
Warren, J.E., et al: "The Behavior of Naturally Fractured Reservoirs", SPE Papers, XX, XX, vol. 3, No. 3, Sep. 1, 1963, pp. 245-255, XP002058945.
Sabathier, J.C., et al: "A New Approach of Fractured Reservoirs", Society of Petroleum Engineers Journal, Dallas, TX, US, No. 39825, Mar. 3, 1998, pp. 49-59, XP002269337, ISSN: 0197-7520.

* cited by examiner

*Primary Examiner* — Omar Fernandez Rivas
*Assistant Examiner* — Nithya Janakiraman
(74) *Attorney, Agent, or Firm* — Antonelli, Terry, Stout & Kraus, LLP.

(57) ABSTRACT

A method for optimizing the development of a fluid reservoir by accounting for a transient exchange term between porous blocks and fractures. The reservoir is discretized into a set of grid cells and an image representative of the fracture network delimiting porous blocks and fractures is associated with each cell. A transient exchange flow occurring between the porous blocks and the fractures is then determined at each cell by processing the image representative of the fracture network. Fluid flows in the reservoir are simulated by a flow simulator and an exchange flow and development of the reservoir is optimized by the simulation.

4 Claims, 3 Drawing Sheets

METHOD OF OPTIMIZING THE DEVELOPMENT OF A FLUID RESERVOIR BY TAKING INTO ACCOUNT A GEOLOGIC AND TRANSIENT EXCHANGE TERM BETWEEN MATRIX BLOCKS AND FRACTURES

BACKGROUND OF THE INVENTION

1. Field of the Invention

The present invention relates to the optimization of development of underground reservoirs such as hydrocarbon reservoirs notably comprising a fracture network.

2. Description of the Prior Art

The petroleum industry, and more precisely reservoir exploration and development notably of petroleum reservoirs requires knowledge of the underground geology as perfectly as possible to efficiently provide evaluation of reserves, production modelling or development management. In fact, determining the location of a production well or of an injection well, the drilling mud composition, the completion characteristics, selection of a hydrocarbon recovery method (such as waterflooding for example) and of the parameters required for implementing the method (such as injection pressure, production flow rate, etc.) requires good knowledge of the reservoir. Reservoir knowledge notably is knowledge of the petrophysical properties of the subsoil at any point in space.

The petroleum industry has for a long time used field (in-situ) measurements with experimental modelling (performed in the laboratory) and/or numerical modelling (using softwares). Petroleum reservoir modelling thus is a technical stage that is essential for any reservoir exploration or development procedure. The goal of modelling is to provide a description of the reservoir.

Fractured reservoirs are an extreme type of heterogeneous reservoirs comprising two very different media, a matrix medium containing the major part of the oil in place and having a low permeability, and a fractured medium representing less than 1% of the oil in place and highly conductive. The fractured medium itself can be complex, with different sets of fractures characterized by their respective density, length, orientation, inclination and opening.

Engineers in charge of the development of fractured reservoirs need to perfectly know the role of fractures. What is referred to as fracture is a plane discontinuity of very small thickness in relation to the extent thereof, representing a rupture plane of a rock of the reservoir. On the one hand, knowledge of the distribution and of the behavior of these fractures allows optimizing the location and the spacing between wells to be drilled through the oil-bearing reservoir. On the other hand, the geometry of the fracture network conditions the fluid displacement, at the reservoir scale as well as the local scale where it determines elementary matrix blocks in which the oil is trapped. Knowing the distribution of the fractures is therefore also very helpful, at this stage, to the reservoir engineer who wants to calibrate the models he or she constructs to simulate the reservoirs in order to reproduce or to predict the past or future production curves. Geoscientists therefore have three-dimensional images of reservoirs allowing locating a large number of fractures.

Thus, in order to reproduce or to predict (i.e. "simulate") the production of hydrocarbons when starting production of a reservoir according to a given production scenario (characterized by the position of the wells, the recovery method, etc.), reservoir engineers use a computing software referred to as reservoir simulator (or flow simulator) that calculates the flows and the evolution of the pressures within the reservoir, and the results of these computations enable them to predict and to optimize the reservoir in terms of flow rate and/or of amount of hydrocarbons recovered. Calculation of the reservoir behavior according to a given production scenario constitutes a "reservoir simulation".

There is a well-known method for optimizing the development of a fluid reservoir traversed by a fracture network, wherein fluid flows through the reservoir are simulated through simplified but realistic modelling of the reservoir. This simplified representation, which is referred to as "double-medium approach", is provided by Warren J. E. et al. in "The Behavior of Naturally Fractured Reservoirs", SPE Journal (September 1963), 245-255. This technique considers the fractured medium as two continua exchanging fluids with one another: matrix blocks and fractures. One then refers to a "double medium" or "double porosity" model. Thus, "double-medium" modelling of a fractured reservoir discretizes this reservoir into two sets of superposed grid cells making up the "fracture" grid and the "matrix" grid. Each elementary volume of the fractured reservoir is thus conceptually represented by two grid cells, a "fracture" cell and a "matrix" cell, coupled to one another (i.e. exchanging fluids). In the reality of the fractured field, these two cells represent all of the matrix blocks delimited by fractures present at this point of the reservoir. In fact, in most cases, the cells have hectometric lateral dimensions (commonly 100 or 200 m) considering the size of the fields and the limited possibilities of simulation softwares in terms of computing capacity and time. The result thereof is that, for most fractured fields, the fractured reservoir elementary volume (cell) comprises innumerable fractures forming a complex network that delimits multiple matrix blocks of variable dimensions and shapes according to the geological context. Each constituent real block exchanges fluids with the surrounding fractures at a rate (flow rate) that is specific thereto because it depends on the dimensions and the shapes of this particular block.

In the face of such a geometrical complexity of the real medium, the approach is, for each reservoir elementary volume (grid cell), in representing the real fractured medium as a set of matrix blocks that are all identical, parallelepipedic, defined by an orthogonal and regular network of fractures oriented along the main directions of flow. A matrix block referred to as "representative" (of the real (geologic) distribution of the blocks), single and of parallelepipedic shape is thus defined for each cell. It is then possible to formulate and to calculate the matrix-fracture exchange flows for this "representative" block and to multiply the result by the number of such blocks in the elementary volume (cell) to obtain the flow at the scale of this cell.

In the "single permeability" version of the double-medium model, the flow of the fluids at the reservoir scale is assumed to occur only via the fractures (i.e. via the single fracture grid), fluid exchanges occurring locally between the fractures and the matrix blocks (that is between the two cells of a given pair of fracture and matrix cells representing the fractured porous reservoir at a given point of the field). In the "double permeability" version of this model, the fluid flow occurs within the two "fracture" and "matrix" media at the reservoir scale, still with local fracture-matrix fluid exchanges taking place locally between the fractures and the matrix blocks.

Such a representation (modelling) of the real (geological) fractured reservoir is used to reproduce, that is to "simulate", the response (behavior) of the field as it is produced. Flow or transfer equations are therefore formulated, explicited and solved for each constituent cell of the model according to the method summed up hereafter. The set of mathematical equations applied to the double medium representing the fractured reservoir constitutes the double-medium reservoir simulator which is well known.

A reservoir simulator allows, from input data concerning on the one hand both media (matrix and fracture) and, on the other hand, the fluids that this double medium contains, to determine, at various times (time steps) and at each cell, the values of various parameters quantifying the state of these two media, such as saturations (oil, gas, water), pressures, concentrations, temperatures, etc. This simulator solves two sets of equations, one relative to the matrix medium, and the other relative to the fractured medium. As a matter of interest, it is noted that these equations express the mass (per constituent) and energy balances for each one of the "fracture" and "matrix" cells representing each elementary volumes of the real reservoir. These mass balances involve exchange flows between cells of the same medium (fracture or matrix) next to each other in space, the matrix-fracture exchange term that is the object of the present invention, a possible injection or production term if a well runs through the elementary volume considered, all of the aforementioned flow terms being equal to the matter or energy accumulation term of the cell being considered. Thus, the equations relative to the "matrix" medium and to the "fracture" medium at each point of the reservoir are coupled, via an exchange term describing the (matter or energy) exchange flows between the porous (matrix) rock and the fractures running therethrough. This matrix-fracture exchange modelling is essential because the matrix contains in most cases the main part of the reserves to be produced.

The method adopted to date for formulating these matrix-fracture exchanges is, for each pair of fracture and matrix cells discretizing the double-medium model: (on the one hand) determining the dimensions of identical matrix blocks (in dimension and shape) assumed to be representative of the complex real distribution of the blocks present in this elementary reservoir volume, and then formulating and calculating the matrix-fracture exchange flow according to the dimensions of the representative block thus calculated with this flow then being equal to the flow expressed for such a representative block multiplied by the number of such blocks in the cell considered.

Thus, the exchange formulations adopted to date in fractured reservoir simulators, based on a very simplified representation of this type of reservoir, prove to be very approximate and incapable of giving an accurate account of all of the exchange mechanisms likely to be involved, which include the pressure diffusivity, the capillarity, the gravity, the molecular diffusion, the conduction and viscous forces.

In fact, on the one hand, the exchange between matrix blocks and fractures is expressed at the (hectometric) scale of the cell of the simulation model, considering that a matrix block of fixed dimensions and shape is representative of ("equivalent to") all of the real (geologic) blocks of the cell.

On the other hand, the exchange is assumed to be pseudo-permanent, that is the exchange flow at the boundaries of this equivalent block is proportional to the potential difference (for example: pressure difference, temperature difference, etc.) between the two matrix and fracture media. For each medium, this potential (temperature for example) is assumed to be uniform within a given medium, thus, in the present case, uniform (constant) within each block representative of the cell considered at the simulation time. Now, exchanges between fractures and blocks, notably if they involve several fluid phases, are not instantaneous. Furthermore, apart from the gravity and viscous entrainment effects (through fracture flow), these exchanges first concern the periphery of the blocks before they propagate to the center thereof. This spatial non-uniformity of the change of state of the matrix blocks also induces a non-stationary time evolution since the fluid of the fracture reaches much more rapidly the edges of the block than the center thereof. An accurate reproduction of the change of state of the blocks would thus require discretizing the block in order to simulate the displacements at a local scale (intra-block). The resultant of these flows at the block-fracture boundary then constitutes a much more accurate estimation of the matrix-fracture exchange over time.

SUMMARY OF THE INVENTION

The invention thus relates to an alternative method for optimizing the development of a fluid reservoir traversed by a fracture network, wherein the transient exchange terms between matrix blocks and fractures are determined directly from geological images of fracture networks, in order to allow the most realistic and reliable possible prediction of the production of fluids contained in fractured and/or faulted porous reservoirs.

The method according to the invention is notably suited for the study of hydraulic properties of fractured formations, notably the study of hydrocarbon displacements in underground reservoirs.

In particular, the invention relates to a method for predicting fluid flows likely to occur through this medium, so as to simulate hydrocarbon production according to various production scenarios.

According to the invention, from direct and indirect reservoir observations the reservoir is discretized into a set of grid cells and an image representative of the fracture network delimiting porous blocks and fractures is associated with each cell.

The method comprises:

determining, within each cell, a transient exchange flow occurring between the porous blocks and the fractures, by processing the image representative of the fracture network;

simulating fluid flows in the reservoir with a flow simulator and of the air transient exchange flow; and optimizing the reservoir development, by the fluid flow simulation.

According to the invention, the transient exchange flow can be determined from the estimation of functions A(X) (A being an area invaded by fluid) and V(X) (V being a volume invaded by fluid), representing for a given cell, an advance of an exchange front within the porous blocks, according to a front advance distance X which depends on time. This relationship can represent, for a given cell, an area of porous blocks invaded by a fluid (two-dimensional application) or a volume of porous blocks invaded by a fluid (three-dimensional application).

The transient exchange flow can be determined from the following stages:

calculating the front advance distance X(t) for each time step t, from fluid flow simulation results at the prior time step t−1, and from the relation representing the exchange front advance;

calculating a geological and transient shape factor $I_A(X(t))$ as a function of the front advance distance X(t) and the relation representing the front advance; and calculating the transient exchange flow using the shape factor.

It is also possible to simulate the fluid flows from a simulator using an implicit type solution method in order to obtain the simulation results for each time step t. The transient exchange flow is therefore incorporated into the implicit solution method by the following:

expressing, for each time step t, the transient exchange flow according to unknown parameters solved by the simulator for each time step t;

expressing a derivative of the transient exchange flow with respect to the unknowns of the simulator; and incorporating the derivative into a system of equations of the simulator.

BRIEF DESCRIPTION OF THE DRAWINGS

Other features and advantages of the method according to the invention will be clear from reading the description hereafter of embodiments given by way of non limitative example, with reference to the accompanying figures wherein.

DETAILED DESCRIPTION OF THE INVENTION

Figure 1:
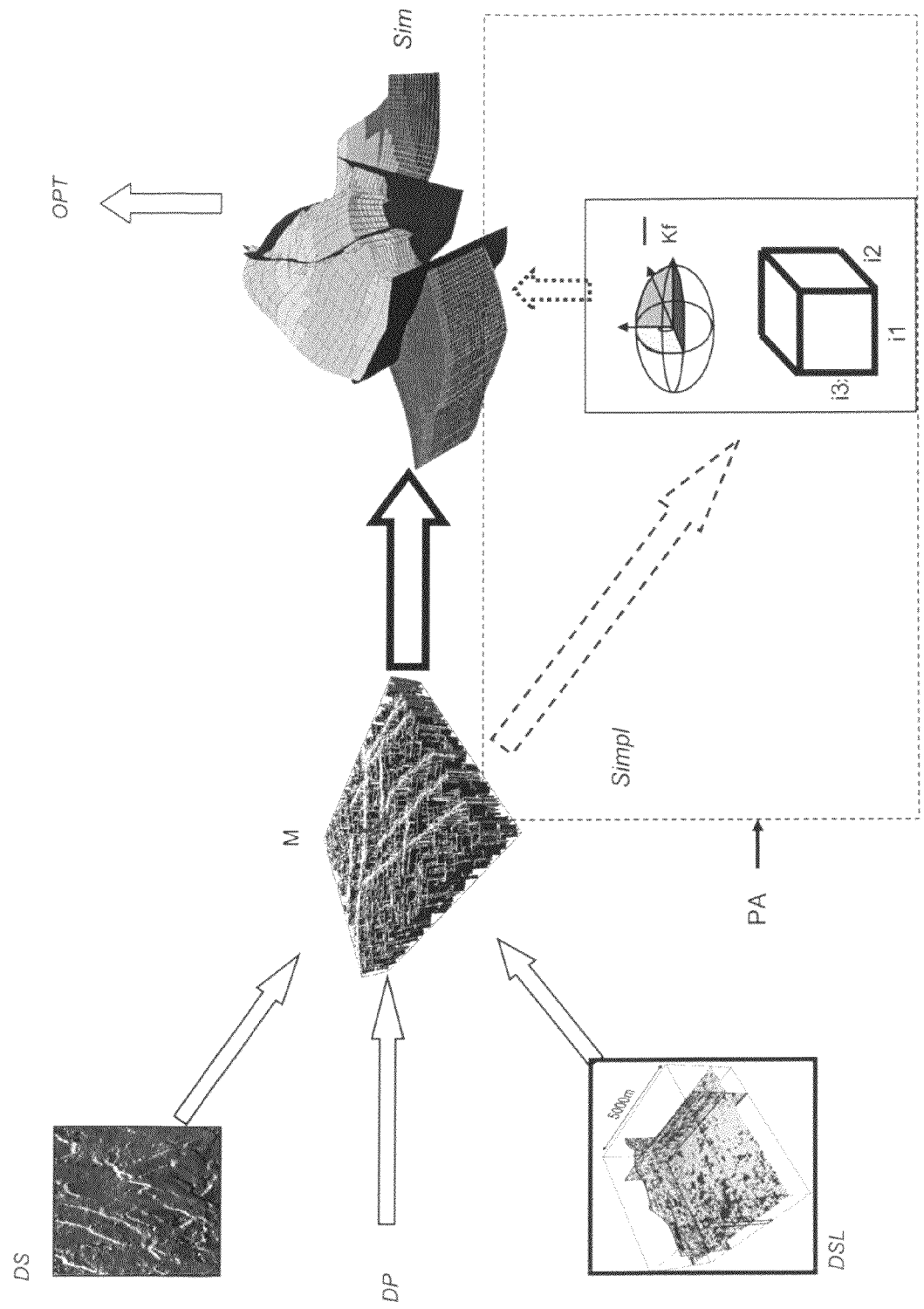
FIG. 1 illustrates the optimization method according to the invention, and a simplification technique used earlier.

The method according to the invention allows optimizing the development of a hydrocarbon reservoir, notably when it comprises a fracture network. FIG. 1 illustrates the method. A geological model of the reservoir under study, having a detailed representation of its real internal complexity, is constructed from seismic data (DS), well data (DP) and sedimentary and lithologic data (DSL). This model comprises a set of grid cells. Each cell (M) contains an image of the fracture network. In FIG. 1, cell M measures 200 m×200 m×10 m. This model makes up a complex porous medium of a set of porous matrix blocks of irregular shapes and sizes. Each block is delimited by fractures.

Considering its geometric complexity, such a model, although representative, cannot be used for reservoir production predictions. It has to be simplified to a model referred to as "equivalent". What is called an "equivalent medium" is a medium whose oil recovery estimation during a displacement process, such as capillary imbibition, is substantially the same as the oil recovery estimation performed on the complex porous medium, that is representative of the various shapes and dimensions of the matrix blocks making up the reservoir considered.

Thus, from this geological model, according to the prior art (PA), a simplified model (simplification (Simpl) by equivalence to a Warren & Root type model) referred to as "equivalent", having blocks of identical dimensions and shapes having the same petrophysical properties and behaving in an equivalent manner in terms of oil recovery, was constructed. For example, the equivalence criterion is based on the oil recovery during a process of capillary imbibition of the blocks involved during water injection.

According to the invention, the exchange flow calculation is done without this equivalent model. Flow simulations (Sim) allowing calculation of more representative, more reliable, more accurate and more numerous production predictions are then carried out. The invention allows taking less risky and faster development decisions (OPT).

The method comprises:
1—Discretization of the reservoir into a set of cells
2—Modelling the fracture network
3—Simulation of the fluid flows
4—Optimization of the reservoir production conditions.
1—Discretization of the Reservoir into a Set of Cells The petroleum industry has combined for a long time field (in-situ) measurements with experimental modelling (performed in the laboratory) and/or numerical modelling (using softwares).

Petroleum reservoir modelling thus is an essential technical stage with a view to reservoir exploration or development. The goal of such modelling is to provide a description of the reservoir, characterized by the structure/geometry and the petrophysical properties of the geologic deposits or its formations.

These models are based on a representation of the reservoir as a set of cells. Each cell represents a given volume of the reservoir and makes up an elementary volume of the reservoir. The cells in their entirety make up a discrete representation of the reservoir, referred to as "geological model."

2—Modelling the Fracture Network

In order to take into account the role of the fracture network in the simulation of flows within the reservoir, it is necessary to associate with each of these elementary volumes (cells) a model of the fractures.

Thus, according to the invention, the method starts from a geological model of the reservoir being studied, that is a detailed representation of the internal complexity of the fracture network which is an as accurate as possible representation of the direct and indirect reservoir observations made by those in charge of reservoir characterization. This model constitutes a complex porous medium of a set of porous matrix blocks, of irregular shapes and sizes, delimited by fractures. This complex porous medium constitutes an image representative of the real network of fractures delimiting the matrix blocks.

Figure 2:
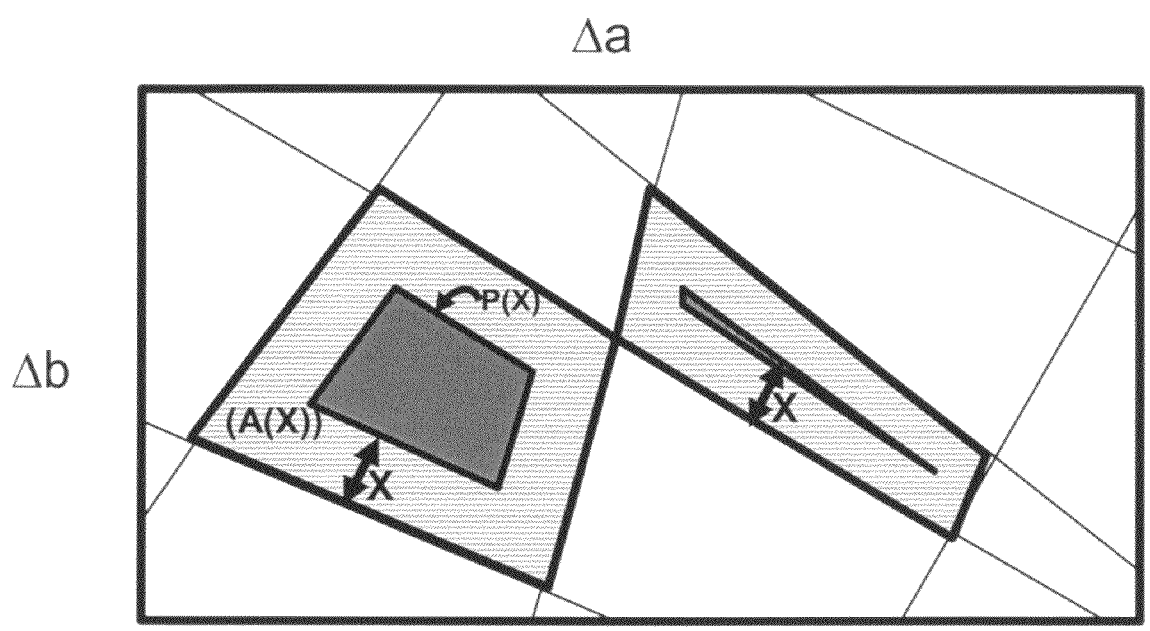
FIG. 2 illustrates a modelling of a fracture network, making up an image representative of the real fracture network delimiting the matrix blocks.

Implementation of such a method can be achieved using known modelling softwares, such as the FRACAFlow® software (IFP, France). Such an image is shown in FIG. 2.

Because of its extreme geometrical complexity, the previous geological model, representative of the real fractured reservoir, cannot be used to simulate, that is reproduce and/or predict, the reservoir's production during a recovery process such as, for example, by waterflooding.

In order to overcome this obstacle, the existing practical method simplifies the model of the real complex porous medium. This method is based on the approach referred to as "double-porosity approach", provided for example by Warren J. E. et al. ("The Behavior of Naturally Fractured Reservoirs", SPE Journal (September 1963), 245-255). The "double-porosity" approach considers the fractured medium as two continua with very different properties and exchanging fluids with one another which are the "fracture" continuum of the fracture network and the "matrix" continuum of the matrix blocks. The combination of the two continua forms a "double medium". Reservoir simulators based on this approach are referred to as "double-porosity" or "double-medium" simulators.

3—Simulation of the Fluid Flows

Principle

At this stage, the reservoir engineer has a geological representation of the fractured hydrocarbon reservoir from which hydrocarbons are to be extracted.

Figure 3:
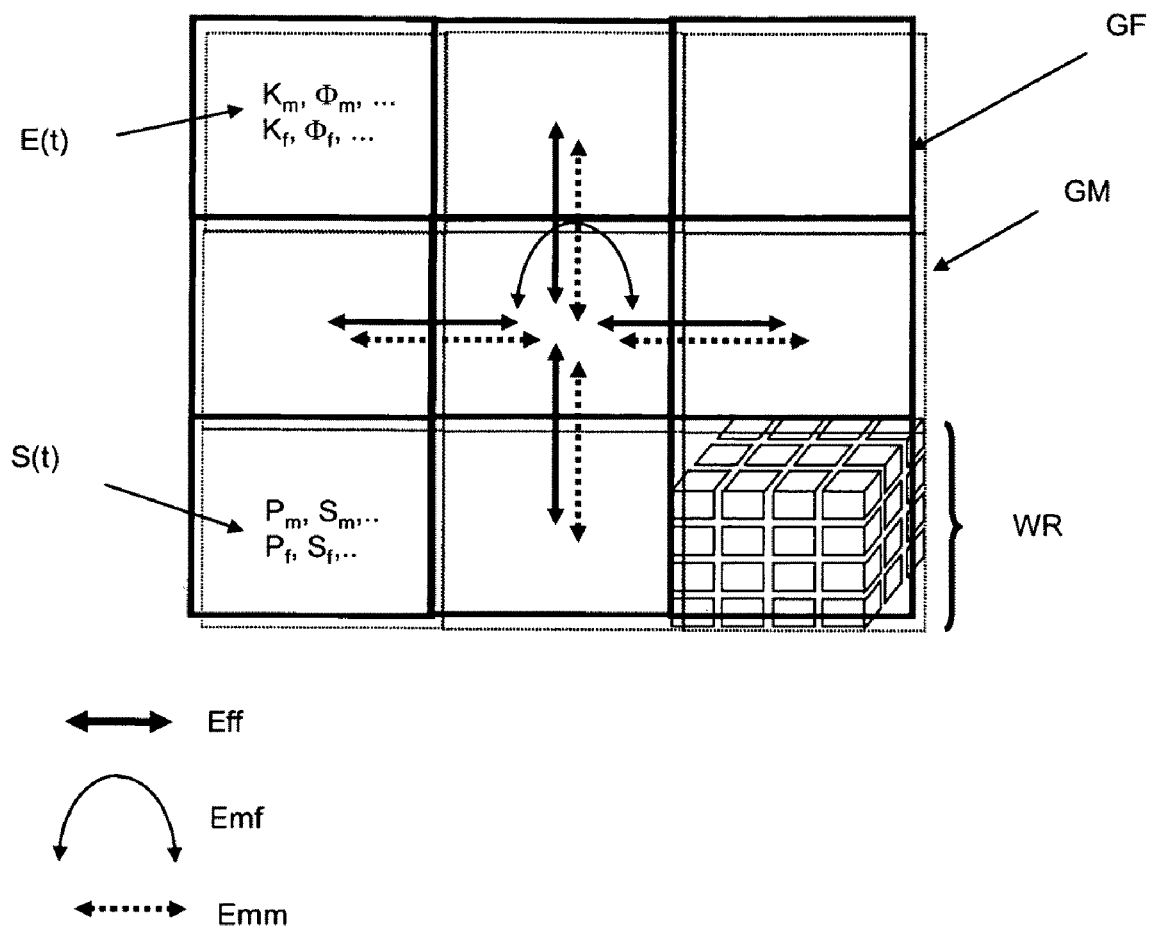
FIG. 3 illustrates the superimposition of two grids, according to the double-medium model, and the various exchanges between these two media.

The well known: double-medium reservoir simulator tool is used. In connection with FIG. 3, each one of the two grids (set of cells) of the reservoir simulator comprises information of input data E(t) concerning, on the one hand, the properties (lithologic facies, permeabilities ($K_m$, $K_f$), porosities ($K_m$, $K_f$), ... ) linked with each of the two "matrix" (for the grid referred to as "matrix" grid-GM) and "fracture" (for the grid referred to as "fracture" grid-GF) media, and on the other hand properties linked with the fluids contained in these two media (densities, viscosities, ... ). In FIG. 3, the exchanges (Eff) within the fracture medium are represented by a full rectilinear arrow; the exchanges (Emm) within the matrix medium are represented by a dotted rectilinear arrow; and the exchanges (Emf) between the matrix medium and the fracture medium for a given pair of cells are represented by a full curvilinear arrow. The matrix blocks are shown for a cell WR.

With this information, the simulator determines, at each cell, and for each time step t, various parameters S(t) such as the oil or water saturation ($S_m$, $S_f$), the pressures ($P_m$, $P_f$) of these oil and water phases, their concentrations, the temperature, etc., depending on the nature of the recovery process (waterflooding, gas flooding, etc.). The simulator therefore solves two sets of coupled equations which is a first set representing the matrix medium and a second set which is relative to the fractured medium. These two sets of equations are coupled via a flow term expressing the mass and/or energy transfers (referred to as "matrix-fracture exchanges") between the porous rock (matrix blocks) and the fractures running therethrough. The matrix-fracture exchange flow (f) depends on the potential difference ($\Delta\phi$) between these two media, with this difference being expressed as a pressure, temperature, ..., difference depending on the nature of the physical exchange process involved in the recovery method applied.

According to the method of the invention, the proportionality factor, referred to as the "exchange factor", which relates the exchange flow to the matrix-fracture potential difference, is now directly deduced from the geological representation of the reservoir (for its geometric component-see below). Furthermore, the evolution over time of this factor (that is its transient character) is from now on taken into account using this geological information. This exchange factor allows accounting for all the diffusive phenomena as a function of time linked with pressure, capillarity, temperature modifications, etc.

The proportionality factor between matrix exchange fracture flow (f) and potential difference ($\Delta\phi$) depends, on the one hand, on the properties of the fluids and of the matrix medium involved by the diffusive phenomenon being considered (mobility $\lambda_p$ of the fluid and permeability $K_m$ of the matrix for example in the case of a multiphase flow of a phase p expressed as $P_{mp} = K_m \cdot \lambda_p$) and, on the other hand, on a geometric coefficient C described hereafter, which leads to the following expression for the exchange flow of phase p, expressed per unit of volume of matrix:

$$f_p = C \cdot P_p \cdot \Delta\Phi_p$$

The geometric coefficient C represents the ratio of the exchange area to the distance of exchange between the fractures and the matrix blocks. The ratio is at the scale of the cell, or elementary (hectometric) reservoir volume which was expressed previously from the dimensions of a block referred to as "equivalent" to the geological representation. The ratio is assumed to be invariable over time and now is directly determined from the geological images of the fractured reservoir which evolve with time (that is it is now transient) according to the data provided by the geologic information.

Calculation of Geological and Transient Geometric Coefficient C

This stage determines, from the complex porous medium constructed in stage 2, parameters characterizing transient exchanges (as a function of time, which constitutes a transition, of the passage from one state to another) between the matrix blocks and the fractures, for any cell of the model and any simulation time step.

First consideration is, by way of example, the case of 2D exchanges within the layers, corresponding to the case of fractures substantially orthogonal to the layer boundaries, with a capillary continuity of the matrix medium between layers. Generalization of the method to three dimensions is described later.

Within a cell of dimensions $\Delta a$, $\Delta b$ and of thickness $\Delta c$, geometric coefficient C can be written as follows:

$$C = \Delta a \Delta b \cdot I_A(X)$$

with:
X: distance of penetration of the fluid in the cell at the time t being considered
$I_A(X)$: geologic and transient shape factor (it is geometric coefficient C related to the matrix area unit). In connection with FIG. 2, the shape factor is expressed as follows:

$$I_A(X) = \frac{1}{\Delta a \Delta b} \frac{1}{\int_0^X \frac{dx}{P(x)}}$$

where P(X) is the total perimeter (that is at cell scale) of the exchange front at the distance X from the boundary of each block of the cell considered at the time being considered. x is the distance variable: $0 < x < X = X(t)$.

FIG. 2 illustrates, within a cell of dimensions $\Delta a$ and $\Delta b$, blocks separated by fractures. On two of these blocks, the invaded matrix areas A(X) are shown by hatching.

Calculation of the geologic and transient shape factors is performed by pre-calculating for each reservoir cell function $I_A(X)$, X ranging from 0 to $X_{max}$. $X_{max}$ varies as a function of the cell and is known since the upper boundary of penetration distances X can be determined by image processing of the geological representation of the fracture network observed at that point of the reservoir.

To calculate shape factor $I_A(X)$, it is noted that:

$$P(x) = \frac{\partial A(x)}{\partial x} = A'(x)$$

The image of the geological fracture network of each reservoir cell is thus first processed in order to obtain function A(X) for each cell.

Determination of A(x), $0 < x < X$, $0 < X < X_{max}$

When starting hydrocarbon production of a fractured reservoir, the stresses undergone by the latter (injection, withdrawal) cause changes (disturbances) in the pressure, the fluid saturation, etc. (depending on the recovery method selected) that rapidly propagate within the fracture network (as it is highly conductive). The result is a pressure, saturation, ..., unbalance between these fractures and the inside of the (hardly conductive) matrix blocks. According to the modelling of the reservoir into a complex porous medium comprising a set of blocks, the disturbance imposed at the boundary of each block (fracture) propagates to the inside of the block. The progress of this disturbance is assimilated, to a first approximation, with that of a front. In the case of a recovery method using waterflooding, it would be a water-oil displacement front. The distance between the edge of a block and this front is denoted by x. Considering the section of the block within the only layer or one of the geological layers that contain it, the surface invaded by the displacing fluid divided by the total block area at this level is identified by A, as a normalized invasion area. The relation connecting A and x is identified by A(x). This function defines physically the advance of the front within the constituent blocks of the fractured medium. Area A is a normalized area, that is referred to the total area of the sections of the blocks contained in the elementary volume (cell) of the fractured reservoir model being studied.

This function A(x) relative to the blocks of the complex porous medium is calculated by an image processing technique applied to the image representative of the real fracture network (complex porous medium) reconstructed at the scale of the elementary units (cells) of the reservoir model being considered.

Various known methods allow determination of the function A(x), such as, for example, the method described in French Patent 2,757,957 corresponding to U.S. Pat. No. 6,064,944.

The fractures are defined by the coordinates of their limit points on a two-dimensional cross-section XY of a layer and the imbibition process through which water is present in the fractures with oil being present in the matrix blocks has to be determined. It is assumed that invasion of the matrix is of piston type. The function x=f(t) that connects the progress of the front (water-oil front for example) to time is the same for all the matrix blocks regardless of their respective shapes and sizes. Function A(x) has no analytical expression. It is calculated from a discretization of cross-section XY of the layer being studied according to the algorithm defined above.

The cross-section XY of the layer being studied is considered as an image with each pixel thereof representing a surface element. These pixels are evenly spaced out by a step dx in direction X and dy in direction Y. The algorithm that is used determines, for each pixel of this image, the minimum distance that separates it from the nearest fracture.

The image is translated by a two-dimensional real number table:

Pict[0:nx+1, 0:ny+1] where nx and ny are the numbers of pixels of the image in directions X and Y. In practice, the total number of pixels (nx·ny) is for example of the order of one million. The values of the elements of table Pict are the distances which are sought.

Initialization: All the pixels traversed by a fracture are at a zero distance from the nearest fracture. For these pixels, table Pict is therefore initialized to value 0. This is done by a known algorithm per se (the Bresline algorithm for example) that is given the coordinates of the pixels corresponding to the two ends of a fracture being considered as a segment of a line and that initializes (to 0 in the present case) the nearest pixels. The other elements of Pict are initialized to a value that is greater than the largest distance existing between two pixels of the image. This value is for example nx·dx+ny·dy.

Calculation: For a given pixel, calculation of the distance being sought to the nearest fracture is done from the distance values that have already been calculated for the neighboring pixels. It is assigned a value that, if it is less than the value initially assigned thereto, is the minimum of the values of the neighboring pixels to which the distance of these pixels from the pixel considered is added.

This calculation is carried out in two successive stages. During the descending pass, the image is scanned line by line, from the top downwards and from left to right (from Pict [1,1] to Pict [nx,ny]). The pixels that are taken into account are different according to whether a descending pass or an ascending pass is used.

The oblique deviation dxy being defined as: $dxy=\sqrt{dx^2+dy^2}$, the algorithm is written:

```
for j=1 to ny
   for i=1 to nx
      | Pict[i,j] = min    Pict[i-1,j] + dx,        : descending pass
      |                    Pict[i-1,j-1] + dxy,
      |                    Pict[i,j-1] + dy,
      |                    Pict[i+1,j-1] + dxy,
      |                    Pict[i,j]
   loop end on i
loop end on j
   for j=ny to 1,
      for i=1x to 1,
      | Pict[i,j] = minPict[i+1,j] + dx,            : descending pass
      |                    Pict[i+1,j+1] + dxy,
      |                    Pict[i,j+1] + dy,
      |                    Pict[i-1,j+1] + dxy,
      |                    Pict[i,j]
   loop end on i
loop end on j
```

Histogram: From table Pict which is calculated, a histogram can be drawn by classifying the non-zero values (those assigned to the pixels outside the fractures) by an ascending order.

The cumulative histogram gives, for any distance defining two intervals of the histogram, the number of non-zero pixels whose value is less than this distance. In the described application to a fractured porous medium where this distance corresponds to the water front progress, the cumulative histogram thus indicates the water-invaded area. Curve A(x) is obtained by dividing this cumulative value by the total number of non-zero pixels (so as to normalize it). The number of intervals used on the abscissa for the histogram corresponds to the number of discretization points of curve A(x). It is selected equal to 500 for example.

Determination of $I_A(X)$

For each value of x ranging between 0 and X (X=distance separating the front from the block (fracture) limits at the time considered), the derivative A'(x) of function A(x) with respect to x is calculated, and the inverse of function A'(x)=P(x) is integrated from 0 to X, which thus leads to a point of the function $I_A(X)$ of the cell being considered of dimensions Δa and Δb:

$$I_A(X) = \frac{1}{\Delta a \Delta b} \frac{1}{\int_0^X \frac{dx}{P(x)}}$$

Flow Simulation

The reservoir engineer chooses a production process, for example the waterflooding recovery technique, for which the optimum implementation scenario remains to be specified for the field being considered. The definition of an optimum waterflooding scenario for example sets the number and the location (position and spacing) of the injector and producer wells in order to best take account of the impact of the fractures on the progression of the fluids within the reservoir.

According to the scenario that is selected, the double-medium representation of the reservoir and the formula relating the mass and/or energy exchange flow to the matrix-fracture potential difference, it is then possible to simulate the expected hydrocarbon production by the flow simulator referred to as double-medium simulator.

At any time t of the simulated production, from input data E(t) (fixed or simulated-time varying data) and from the formula relating exchange flow (t) to potential difference ($\Delta\phi$), the simulator solves all the equations specific to each cell and each one of the two grids of the model (equations involving the matrix-fracture exchange formula described above). The simulator delivers the values solution to the unknowns S(t) (saturations, pressures, concentrations, temperature, etc.) at time t. This solution provides knowledge of the amounts of oil produced and of the state of the reservoir (pressure distribution, saturations, etc.) at the time considered. However, the transient exchange flow, as described above, involves time-variable parameters, notably the position of front X(t) (distance between the edge of the blocks and the front) at the time t being considered:

$$f_p = C \cdot P_{mp} \cdot \Delta\Phi_p \text{ with: } C = \Delta a \Delta b \cdot I_A(X)$$

On the one hand, a fixed value of the invaded (or disturbed) area A corresponds to any position X of the progression front of the disturbance being considered (pressure, etc.) within the blocks. On the other hand, the value of the unknown (pressure, saturation, etc.), S, describing the mean state of the blocks of the elementary volume of the model is proportional to the value A(X) of the invaded (normalized) area at the time t being considered. Thus, the unknown variable S normalized between 0 and 1 can be assimilated with the invaded area A (already normalized according to the definition given above), that is finally:

$$Sn(t) \approx A(X)$$

where Sn(t) is the normalized variable S(t), X=X(t).

Thus, at any simulation time t, the distance of penetration X of the exchange front within the blocks of the cell can be related to unknown S(t) via inverse function $A^{-1}$ (function known at the end of processing stage of the geological image of the fracture network):

$$X(t) = A^{-1}(Sn(t))$$

It should be noted that Sn(t) is the unknown solved by the simulator at time step t. Two determination modes can therefore be selected for X(t):
explicit determination of X(t), that is from the unknowns solved at the previous time step (t−1),
implicit determination of X(t), that is simultaneously with the other unknowns S(t).

Described hereafter is the explicit approach allowing determination of X(t) and the transient matrix-fracture exchange flow at each simulation time step t, for any cell of the model:
The calculation of X(t): is carried out from the unknown (state of the blocks) normalized at the previous time step, denoted by (t−1):

$$X(t) = A^{-1}(Sn(t-1))$$

The calculation of $I_A(X(t))$ equals:

$$I_A(X(t)) = \frac{1}{\Delta X \Delta Y} \frac{1}{\int_0^{X(t)} \frac{dx}{P(x)}}$$

where X(t) is the upper boundary of integration of the function $$\frac{1}{P(x)} = \frac{1}{A'(x)}$$

The calculation of $f_p$ equals:

$$f_p = C \cdot P_{mp} \cdot \Delta\Phi_p \text{ with:}$$

$$C = \Delta a \Delta b \cdot I_A(X(t))$$

In order to be able to initiate the simulation according to this explicit approach, that is with a view to the solution of the first production time step by the simulator, X has to be initialized at a very small value in relation to $X_{max}$, but not equal to zero.

Although this explicit calculation (from the unknowns solved at the previous time step) can prove to be sufficient (that is sufficiently accurate), an implicit calculation is however possible. In this case, variable X(t) expressed at time step t, that is $X(t) = A^{-1}(Sn(t))$, is incorporated in the system of equations to be solved at the time step t. More precisely, incorporated into this system is the derivative of the transient exchange flow with respect to the unknown Sn of the model, by the expression of the geological and transient shape factor $I_A(X(t))$ as a function of advance distance X(t), which is itself a function of unknown Sn as mentioned above.

4—Optimization of the Reservoir Production Conditions

Selecting various scenarios characterized, for example, by various respective sites for the injector and producer wells, and simulating the hydrocarbon production for each one according to stage 3 enables selection of the scenario allowing the production of the fractured reservoir considered to be optimized according to the technico-economic criteria selected.

Generalization to the 3D Case

Within the context of matrix-fracture exchanges taking place in the three directions of space, the transient geometrical coefficient relative to exchanges between matrix blocks and fractures is written as follows:

$$C = \Delta a \Delta b \Delta c \cdot I_V(X)$$

with the $I_V(X)$ 3D geological and transient shape factor being expressed as follows:

$$I_V(X) = \frac{1}{\Delta a \Delta b \Delta c} \frac{1}{\int_0^X \frac{dx}{S(x)}}$$

where S(X) is the total surface area (that is at the cell scale) of the exchange front that has reached distance X from the boundary of each block of the cell considered at the simulated time (time step).

Similar to the case of a two-dimensional exchange, it is noted that:

$$S(x) = \frac{\partial V(x)}{\partial x} = V'(x)$$

where V(x) is the function relating the invaded (normalized) matrix volume to the distance of penetration of the fluid x. This function is calculated in the same way as function A(X), from the geologic image of the fracture network.

Thus, functions A(X) and V(X) each represent a relation representing, for a given cell, the advance of an exchange front within the porous blocks, as a function of the advance distance X of the front. In two dimensions, this relation represents, for a given cell, the area A(X) of porous blocks invaded by a fluid. In three dimensions, this relation represents, for a given cell, the volume V(X) of porous blocks invaded by a fluid.

Advantages

The present invention thus is an alternative method for optimizing the development of a fluid reservoir traversed by a fracture network, wherein prediction of the matrix-fracture exchanges by fractured reservoir (double medium) simulators is simplified and made more reliable.

According to the invention, the images of the fracture/fault networks obtained from the geological description, characterization and/or modelling of fractured reservoirs, are now used to predict exchanges between the porous blocks and the fractures over time, without any prior simplification (scaling) of these images, and while taking account of the gradual character of the change of state of the blocks.

Thus, this invention shortens and simplifies the geological information integration process with a view to production predictions.

The invention also makes these predictions more reliable and accurate for the related two reasons as follows:
The geological information relative to the varied (complex) distribution of the shapes and dimensions of the blocks is directly integrated into the reservoir simulator without being distorted (that is approximated/modified), and
unlike the double-porosity simulators commonly used, the gradual (transient) character of the change of state of the matrix blocks during production is taken into account, on the basis of the real (geological) distribution of the blocks of various sizes and shapes.

Finally, the invention fits well into the existing expertise and practices, that is with the grid pattern, the general equations of the flow model and a double-medium model in the present case, are preserved, which meets the essential condition of applicability of the invention which is that the possibility of providing results (production predictions necessary for selection of a recovery process, of the number/type of wells, etc.) for large-size reservoirs and within a realistic time limit (i.e. at the end of reasonable calculating times). In fact, using a grid pattern true to the geometric complexity of the real fracture network would be inconceivable at the scale of a reservoir of kilometric dimensions.

In general terms, the invention allows prediction of the hydrodynamic behavior (flow rate, pressure, etc.) of fractured fields (or considered or modelled as such) in response to exterior stresses imposed via wells during hydrocarbon production.

Engineers in charge of reservoir development therefore have a tool allowing them to rapidly evaluate the performance of various production scenarios and thus to select the one that optimizes the development from the viewpoint of the criteria, which are selected by the operator, ensuring for example an optimum hydrocarbon production in terms of flow rate and recovery.

The invention thus finds an industrial application in the development of any type of underground reservoir traversed by a fracture network. It can be, for example, a hydrocarbon reservoir whose production is to be optimized, or a gas storage reservoir for example, whose injection or storage conditions are to be optimized.

The invention claimed is:

1. A method for optimizing development of a fluid reservoir traversed by a fracture network, wherein the fluid reservoir is discretized into a set of grid cells and an image representative of the fracture network defining porous blocks and fractures is associated with each grid cell, from direct and indirect reservoir observations, comprising:
    determining, within each cell, a transient exchange flow occurring between the porous blocks and the fractures, by processing the image representative of the fracture network;
    simulating fluid flows in the reservoir by using a computer implemented flow simulator and the transient exchange flow; and
    optimizing the reservoir development by using the simulating fluid flows in the reservoir; and wherein
    the transient exchange flow is determined from estimation of a relationship representing, for a given cell, an advance of an exchange front within the porous blocks, according to an advance distance of the exchange front and the transient exchange flow is determined by calculating the advance distance of the exchange front for a time step from fluid flow simulation results for a prior time step and from a relationship representing the advance of the exchange front, calculating a geological and a transient shape factor according to the advance distance of the exchange front and the relationship representing the advance of the exchange front, and calculating the transient exchange flow using the transient shape factor.

2. A method as claimed in claim 1, wherein the relationship represents, for a given grid cell, an area of porous blocks which are invaded by a fluid.

3. A method as claimed in claim 2, wherein the fluid flows are simulated from a simulator using an implicit solution to obtain simulation results for each time step, by incorporating the transient exchange flow into the implicit solution by expressing, for each time step, the transient exchange flow according to unknowns solved by the simulator for the time step,
    expressing a derivative of the transient exchange flow with respect to unknown parameters of the simulator, and incorporating the derivative into a system of equations of the simulator.

4. A method as claimed in claim 1, wherein the fluid flows are simulated from a simulator using an implicit solution to obtain simulation results at each time step, by incorporating the transient exchange flow into the implicit solution by expressing, for each time step, the transient exchange flow according to unknowns solved by the simulator for the time step,
    expressing a derivative of the transient exchange flow with respect to unknowns of the simulator, and incorporating the derivative into a system of equations of the simulator.

* * * * *